US009331485B2

(12) United States Patent
Kim et al.

(10) Patent No.: US 9,331,485 B2
(45) Date of Patent: May 3, 2016

(54) HVDC VALVE TOWER

(71) Applicant: LSIS CO., LTD., Anyang-si, Gyeonggi-do (KR)

(72) Inventors: Young Woo Kim, Seoul (KR); Yong Ho Chung, Ansan-si (KR); Wook Hwa Lee, Incheon (KR); Seung Taek Baek, Anyang-si (KR); Teag Sun Jung, Seoul (KR); Jun Bum Kwon, Seoul (KR)

(73) Assignee: LSIS CO., LTD., Anyang-si (KR)

( * ) Notice: Subject to any disclaimer, the term of this patent is extended or adjusted under 35 U.S.C. 154(b) by 167 days.

(21) Appl. No.: 14/255,655

(22) Filed: Apr. 17, 2014

(65) Prior Publication Data
US 2014/0321095 A1    Oct. 30, 2014

(30) Foreign Application Priority Data

Apr. 30, 2013    (KR) .................. 10-2013-0048597

(51) Int. Cl.
*H05K 7/02*    (2006.01)
*H02J 3/36*    (2006.01)

(52) U.S. Cl.
CPC ... *H02J 3/36* (2013.01); *Y02E 60/60* (2013.01)

(58) Field of Classification Search
CPC ................ H02B 1/01–1/011; H05K 7/203; H02J 3/36; B60P 1/5433; B66C 23/205; Y02E 60/60
See application file for complete search history.

(56) References Cited

U.S. PATENT DOCUMENTS

| 4,002,243 | A | * | 1/1977 | Kramer ................. B66C 23/208 16/368 |
| 5,083,395 | A | * | 1/1992 | Daniels .................. A01K 97/10 212/175 |
| 5,106,255 | A | * | 4/1992 | Motoda ................ B60P 1/5433 212/238 |
| 9,156,614 | B2 | * | 10/2015 | Ono ......................... H02B 3/00 |
| 9,166,383 | B2 | * | 10/2015 | Mazara Diaz ........... H02B 1/50 |

FOREIGN PATENT DOCUMENTS

| JP | 57085581 A | * | 5/1982 |
| JP | 61-188304 | | 8/1986 |
| JP | 06311728 A | * | 11/1994 |
| JP | 06-343267 | | 12/1994 |
| JP | 07-176687 | | 7/1995 |
| JP | 2007-306793 | | 11/2007 |
| JP | 4535251 | | 9/2010 |

OTHER PUBLICATIONS

European Patent Office Application Serial No. 14162262.1, Search Report dated Sep. 2, 2014, 6 pages.
ABB, "Capacitors and Filters Improving Power Quality for Efficiency and Reliability," XP055135143, Nov. 2010, 24 pages.

* cited by examiner

*Primary Examiner* — Robert J Hoffberg
(74) *Attorney, Agent, or Firm* — Lee, Hong, Degerman, Kang & Waimey; Jonathan Kang; Harry Lee

(57) ABSTRACT

Disclosed is a HVDC valve tower. The HVDC valve tower includes cylindrical valve module loading part, a valve module loaded on the valve module loading part, and a crane disposed at a center of the valve module loading part to be rotatable.

7 Claims, 7 Drawing Sheets

HVDC VALVE TOWER

CROSS-REFERENCE TO RELATED APPLICATIONS

Pursuant to 35 U.S.C. §119(a), this application claims the benefit of earlier filing date and right of priority to Korean Patent Application No. 10-2013-0048597, filed on Apr. 30, 2013, the contents of which are hereby incorporated by reference in their entirety.

BACKGROUND

The present disclosure relates to a high voltage direct current (HVDC) valve tower.

A HVDC transmission system is to convert high-voltage AC power produced from a power plant into DC power using an electric power converter, transmit the converted DC power, convert again the DC power into the AC power and then supply the converted AC power.

The HVDC transmission system has some advantages in that it has a low power loss, an insulation work is easy due to its lower voltage compared to the AC power, and a power transmission tower may have a reduced size and height due to its low induced lesion. Further, it is possible to connect two AC systems having different voltages or frequencies and thus to improve stability of the AC systems, and also when an AC system breaks down, it is possible to prevent the breakdown from being spread to other adjacent systems. Therefore, the HVDC transmission system is used as a power system connecting means of new renewable energy, particularly used for power transmission in a large-scale offshore wind generation farm, or the like.

An AC/DC converting device for converting an alternating current into a direct current is provided at a HVDC substation in which the AC power is converted into the DC power.

The AC/DC converting device is also called as a valve module (hereinafter, referred to as the "valve module"). In a current source HVDC system, a thyristor valve is used for the AC/DC converting device, and in a voltage source HVDC system, an IGBT device is used for the AC/DC converting device.

In the HVDC system, the plurality of valve modules are vertically stacked according to a power transfer capability and constitutes a valve tower.

As illustrated in FIG. 1, the valve tower may be fixed to an inner ceiling of the substation in order to protect the valve modules from environmental risk factors such as earthquake.

FIG. 1 is a schematic view illustrating a general valve tower. Referring to FIG. 1, the plurality of valve modules are stacked on and connected with each other through supporting insulators 20 and thus constitutes the valve tower.

The valve modules 10 may be disassembled from the valve tower in order to have a periodic inspection or repair a trouble. However, since the plurality of valve modules 10 are connected in series, a part or the whole of the valve modules 10 should be disassembled from the valve tower in order to separate a specific valve module 10. That is, when separating the uppermost valve module 10, it is necessary to disassemble the valve modules 10, in turn, from the lowermost one. Therefore, the whole of the valve modules 10 should be disassembled in order to separate the specific valve module 10.

FIG. 2 is a schematic view illustrating another general valve tower. Referring to FIG. 2, the plurality of valve modules 10 are stacked on and connected with each other through supporting insulators 20 and thus constitutes the valve tower.

In this case, in order to separate the valve module 10 from the valve tower, a hoist which is moved along a rail installed on the ceiling should be moved to a predetermined position, and then the valve module 10 is separated by an operation of the hoist.

However, since the plurality of valve towers are generally installed over a comparatively wide area, the rail for moving the hoist should be also installed over the whole ceiling, and thus the cost of equipment is increased. Further, since it is necessary to move the hoist at the predetermined position and then perform the operation of the hoist, it takes a long period of working time.

SUMMARY

Embodiments provide a HVDC valve tower in which valve modules used in a high voltage direct current (HVDC) system are stacked up and down to have a cylindrical shape.

In one embodiment, a HVDC valve tower includes a cylindrical valve module loading part, a valve module loaded on the valve module loading part, and a crane disposed at a center of the valve module loading part to be rotatable.

The valve module loading part may have a plurality layers disposed up and down.

The valve module loading part may include a plurality of bottom frames disposed up and down, a sliding part coupled to the bottom frame to be slid in a radial direction, and a valve module disposed on the sliding part.

The sliding part may include a guide part configured to be fixed to the bottom frame, and a moving part configured to be guided by the guide part to be moved in the radial direction, and the valve module may be located on the moving part.

The moving part may include a first cut-away part passing through the moving part up and down.

The bottom frame may have a second cut-away part passing through the bottom frame up and down.

The first and second cut-away parts may be disposed to be overlapped with each other.

A crane fixing part which is coupled with a crane may be provided on an upper portion of the valve module.

A protruding part may be provided at a lower portion of the valve module, and the moving part may have a concave portion which is opened upwardly and dented concavely downwardly, and the protruding part may be received in the concave portion to be slid.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings.

Figure 1:
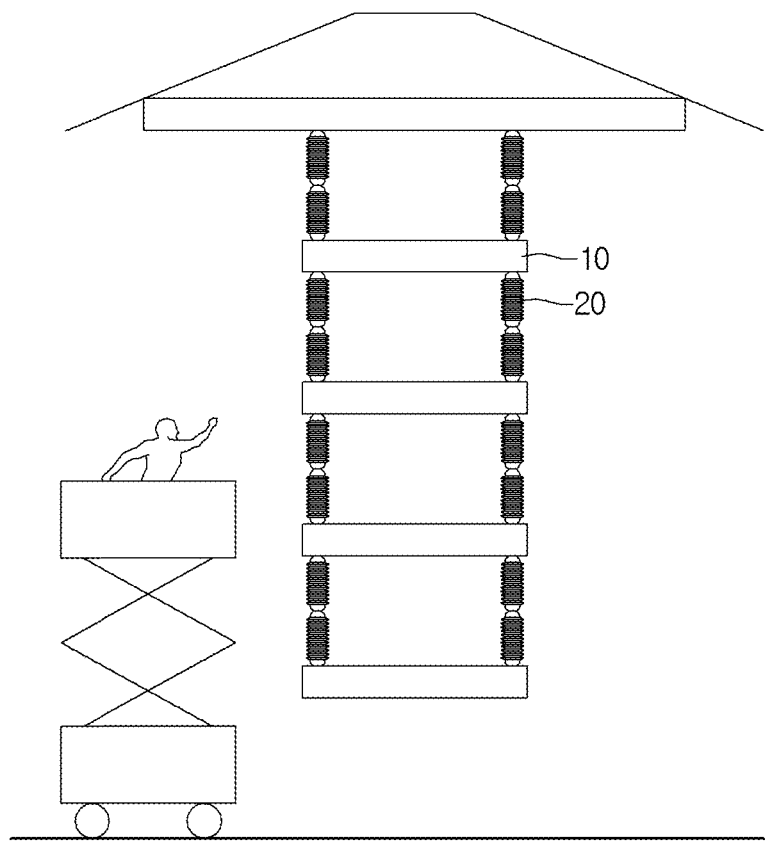
FIG. 1 is a schematic view illustrating a general HVDC valve tower.
Figure 2:
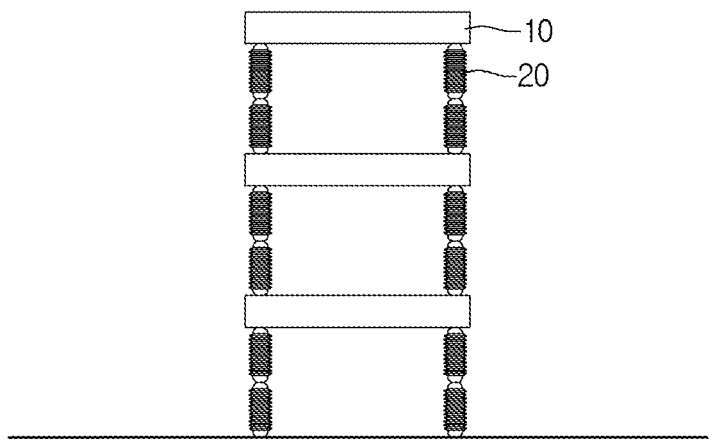
FIG. 2 is a schematic view illustrating another general HVDC valve tower.
Figure 3:
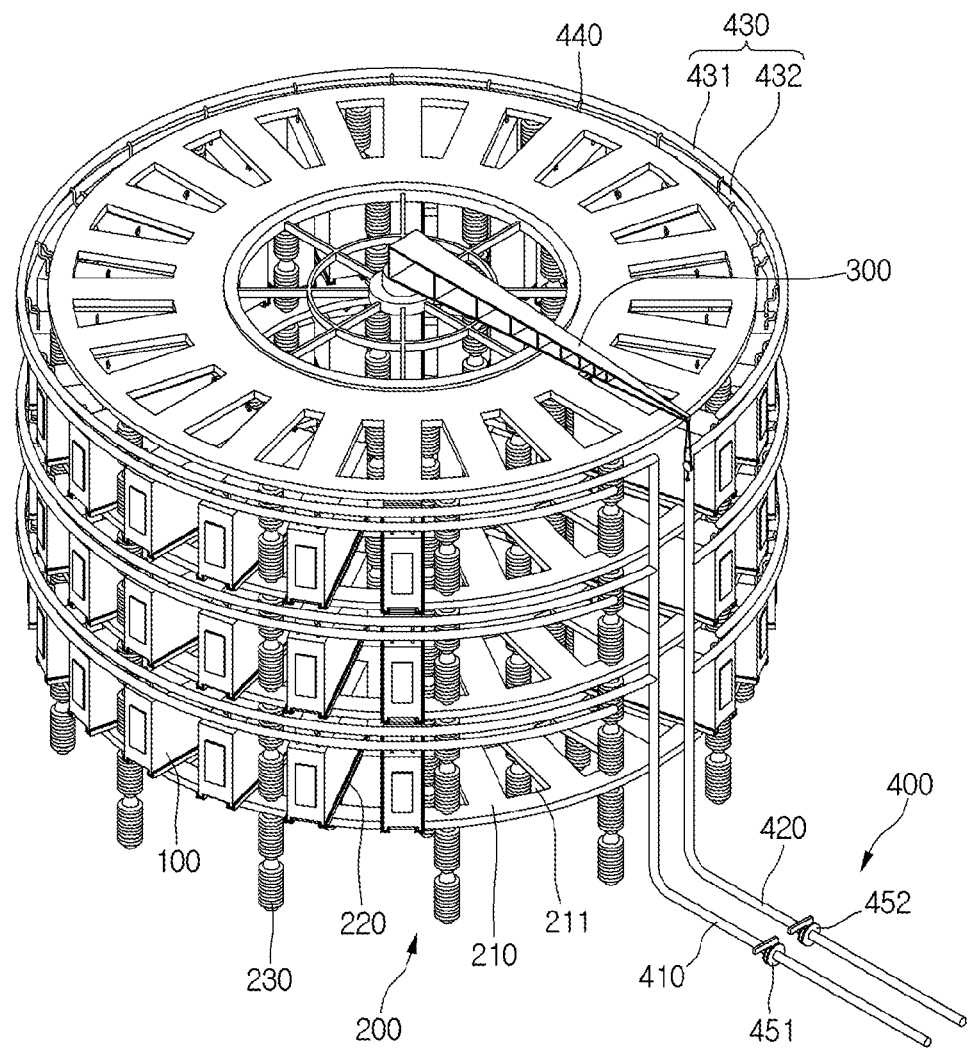
FIG. 3 is a perspective view schematically illustrating a HVDC according to one embodiment.
Figure 4:
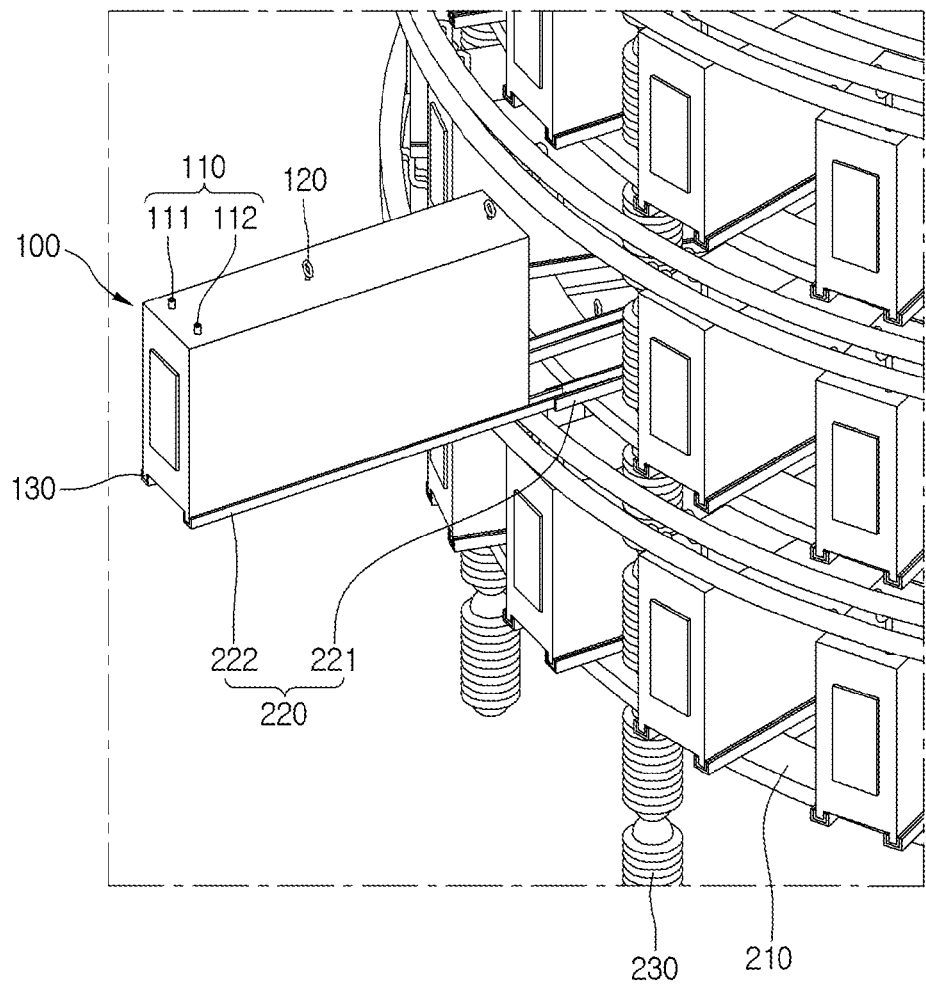
FIG. 4 is a partially enlarged view of FIG. 3.

FIG. 3 is a perspective view schematically illustrating a HVDC according to one embodiment, and FIG. 4 is a partially enlarged view of FIG. 3.

Hereinafter, a configuration of a valve module 100 installed at a HVDC valve tower will be schematically described with reference to FIG. 4, and then a configuration of the HVDC valve tower will be described with reference to FIGS. 3 and 4.

FIG. 4 is an enlarged view illustrating a state in which one valve module 100 and a moving part 222 to be described later are withdrawn. The valve module 100 is to convert the direct current into the alternating current. In a current source HVDC system, a thyristor valve is used for the valve module 100, and in a voltage source HVDC system, an IGBT device is used for the valve module 100. Therefore, the valve module 100 constituting the HVDC valve tower according to one embodiment may be the thyristor valve or the IGBT device.

Referring to FIG. 4, the valve module 100 includes a case having an approximately rectangular parallelepiped outer shape, and various electronic components installed therein. The case of the valve module 100 has two cooling water ports 110. One of the two cooling water ports is an inlet port 111 through which the cooling water is introduced, and the other is an outlet port 112 through which the cooling water circulated in the valve module 100 is discharged.

At this time, the cooling water ports 110 may be provided in an upper surface of the case around an external end of the case. However, the cooling water ports 110 do not necessarily have to be provided in the upper surface of the case. The cooling water ports 110 may be provided in an outer side surface directed in a radial direction of a valve module loading part, or may be provided in both side surfaces disposed at left and right sides of the outer side surface. However, in any case, it is advantage in an aspect of maintenance that the cooling water ports 110 are provided around the external end of the case. For a periodic inspection, a repairing and the maintenance, the corresponding valve module 100 should be withdrawn to an outside of the case. And before the withdrawing of the valve module 100, a cooling water circulation pipe 400 connected to the cooling water ports 110 should be separated from the cooling water ports 110. At this time, it is advantage that the cooling water ports 110 are located around the external end of the case.

Meanwhile, a crane fixing part 120 which is coupled with a crane 300 is provided on an upper portion of the valve module 100. The crane fixing part 120 may be coupled with a hook or ring part of the crane 300.

A protruding part 130 is provided at a lower portion of the valve module 100 to protrude downwardly. The protruding part 130 serves to be inserted into a concave portion of the moving part 222, which is described later, such that the valve module 100 may be stably located on the moving part 222.

Referring to FIGS. 3 and 4, the HVDC valve tower includes the ring-shaped valve module loading part 200 having a predetermined height and width, and the crane 300 disposed at a central portion of the valve module loading part 200, and the cooling water circulation pipe 400 cooling the valve module 100.

More specifically, the valve module loading part 200 has a plurality of layers stacked up and down. Each of the layers includes a bottom frame 210, and a sliding part 220 which is coupled to the bottom frame 210 to be slid in a radial direction.

The bottom frame 210 has an approximately circular plate shape of which a central portion is cut away. Since the bottom frame 210 serves to support the plurality of the valve modules 100, it may be made of a high stiffness material which may stably support a large load.

An upper portion of the bottom frame 210 is coupled with the sliding part 220. The sliding part 220 includes a guide part 221 fixed to an upper surface of the bottom frame 210, and the moving part 222 moved along the guide part 221 in the radial direction.

Here, the guide part 221 may be a pair of rails which are extended in parallel. Further, the moving part 222 may be a pair of bar type members which are extended in a sliding direction.

A first cut-away part 222a (referring to FIGS. 4 and 5d) which passes through the moving part 222 up and down is provided at a central part of the moving part 222. The first cut-away part 222a serves to effectively radiate heat generated from the valve module 100.

At this time, a width between the pair of bar type members defining the moving part 222 should be smaller than that of the valve module 100, such that the valve module 100 may be put on the moving part 222.

Meanwhile, the concave portion which is opened upwardly and dented concavely downwardly may be defined in the moving part 222. The concave portion is a portion in which the protruding part 130 protruding downwardly at the lower portion of the valve module 100 is inserted so that the valve module 100 may be stably located on the moving part 222. Therefore, the protruding part 130 is slidably received in the concave portion.

Meanwhile, the moving part 222 may be a plate-shaped member which is provided to be slid along the rail, instead of the pair of bar type members. At this time, the central portion of the moving part 222 may be cut away to be passed through up and down, and this cut-away portion may define the first cut-away part 222a. As described above, the first cut-away part 222a is to effectively radiate the heat generated from the valve module 100.

Meanwhile, the bottom frame 210 may have a second cut-away part 211 (referring to FIG. 3) which is defined by cutting away a part or the whole of a portion of the bottom frame 210 corresponding to the valve module 100. More specifically, in a state in which the moving part 222 on which the valve module 100 is put is moved to be located at a vertical upper portion of the bottom frame 210, the second cut-away part 211 may be located at a lower side of a portion that the valve module 100 is located.

In a state in which the moving part 222 is moved to an inner side of the bottom frame 210, the first cut-away part 222a and the second cut-away part 211 are overlapped with each other. That is, the first and second cut-away parts 222a and 211 are positioned to be overlapped up and down with each other. Therefore, the heat transferred through a lower portion of the thyristor valve module 100 may be radiated through the first and second cut-away parts 222a and 211.

The crane 300 is installed at a central portion of the valve module loading part 200 having the above-mentioned configuration. As described above, since the valve module loading part 200 has the hollow cylindrical shape, the crane 300 may be installed at the hollow portion.

The crane 300 is installed to rotatable, and a transverse length of an arm of the crane 300 is greater than a radius of the valve module loading part 200.

In the above-mentioned structure, if the moving part 222 is slid to an outside of the bottom frame 210, the valve module 100 is withdrawn to the outside together with the moving part 222, and the withdrawn valve module 100 is lifted up by the crane 300. While towing the valve module 100, the crane 300 is rotated so that the valve module 100 is moved from the vertical upper side of the moving part, and then the crane 300 lifts down the valve module 100 on the ground so as to perform a repairing or replacing operation.

Meanwhile, the cooling water circulation pipe 400 may be installed along an outer circumferential surface of the valve module loading part 200. The cooling water circulation pipe 400 includes an inlet pipe 410 extended up and down, an outlet pipe 420 extended up and down to be parallel with the inlet pipe 410, and a circulation pipe 430 connected with one of the inlet pipe 410 and the outlet pipe 420 and extended circularly.

The circulation pipe 430 is provided up and down in plural. One end of the uppermost circulation pipe 430 is connected to the inlet pipe 410, and other end is maintained in a clogged state. One end of another circulation pipe 430 disposed just under the uppermost circulation pipe 430 is connected to the outlet pipe 420, and other end is maintained in the clogged state.

Hereinafter, the circulation pipe 430 of which the one end is connected to the inlet pipe 410 is referred to as an inlet circulation pipe 431, and the other circulation pipe 430 of which the one end is connected to the outlet pipe 420 is referred to as an outlet circulation pipe 432. That is, the circulation pipe 430 includes the inlet circulation pipe 431 and the outlet circulation pipe 432.

A plurality of connection pipes 440 are branched from each of the inlet circulation pipe 431 and the outlet circulation pipe 432. Pipe of the plurality of connection pipes 440 branched from the inlet circulation pipe 431 are connected to the inlet ports 111 of the valve modules 100, and pipes of the plurality of connection pipes 440 branched from the outlet circulation pipe 432 are connected to the outlet ports 112 of the valve modules 100.

Therefore, the cooling water supplied through the inlet pipe 410 is supplied to the plurality of inlet circulation pipes 431, and then introduced into each valve module 100 through the plurality of connection pipes 440 and each inlet port 111, while passing through the inlet circulation pipe 431.

The cooling water introduced into the valve module 100 is circulated in the valve module 100, performs heat exchange, is discharged through the outlet port 112 of the valve module 100 and then discharged to the outlet circulation pipe 432 through the connection pipe 440. The cooling water discharged to the outlet circulation pipe 432 is discharged to an outside through the outlet pipe 420.

At this time, a valve 451 may be provided at the inlet pipe 410, and another valve 452 may be also provided at the outlet pipe 420.

Hereinafter, a process of separating the valve module 100 from the HVDC tower will be described with reference to FIGS. 5A to 5D.

Figure 5A:
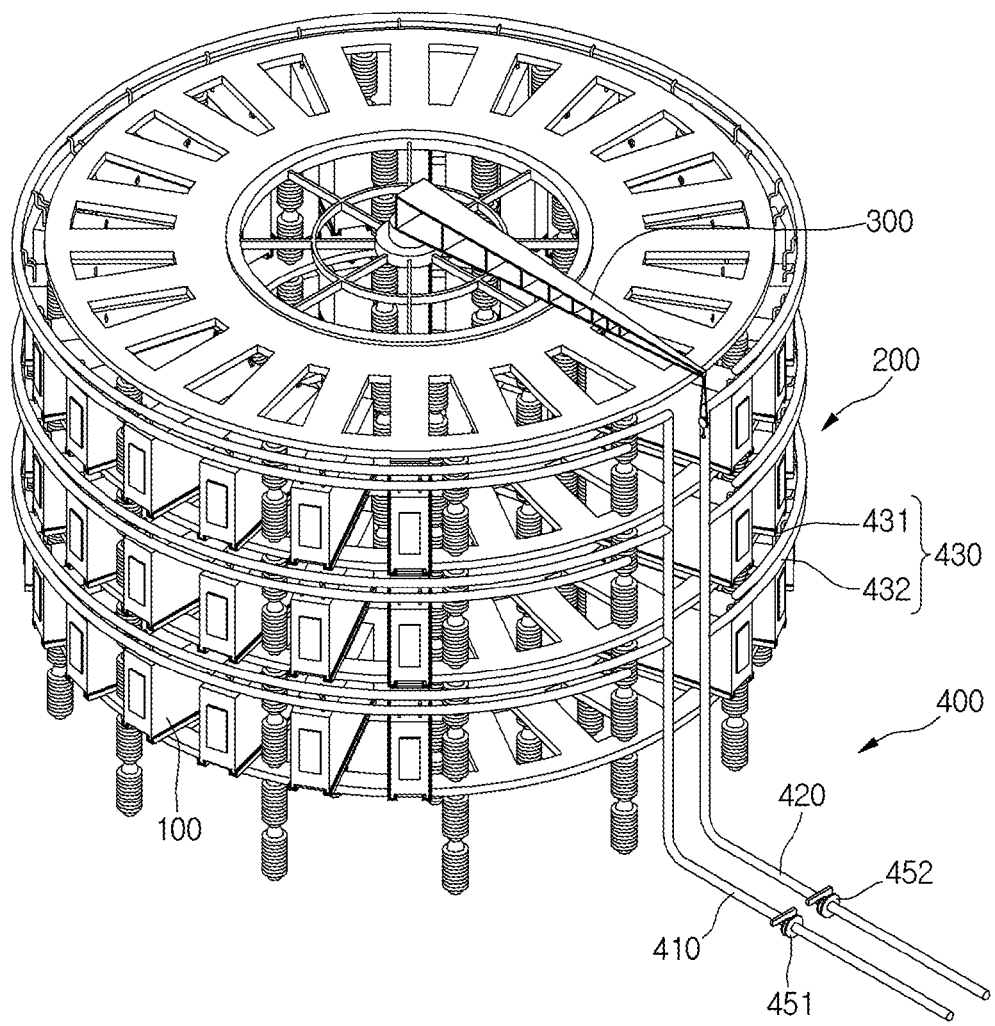
FIGS. 5A to 5D are views illustrating an operating process of the HVDC valve tower according to one embodiment.

As shown in FIG. 5A, at an initial state, if the valve module 100 to be checked, repaired or replaced is decided, the valve 451 installed at the inlet pipe 410 is closed, and the outlet pipe 420 is maintained in an opened state.

The cooling water is completely discharged in this state, and then the connection pipe 430 connected to the valve module 100 is separated. That is, the connection pipes 430 of the circulation pipe are separated from the inlet port 111 and the outlet port 112.

Figure 5B:
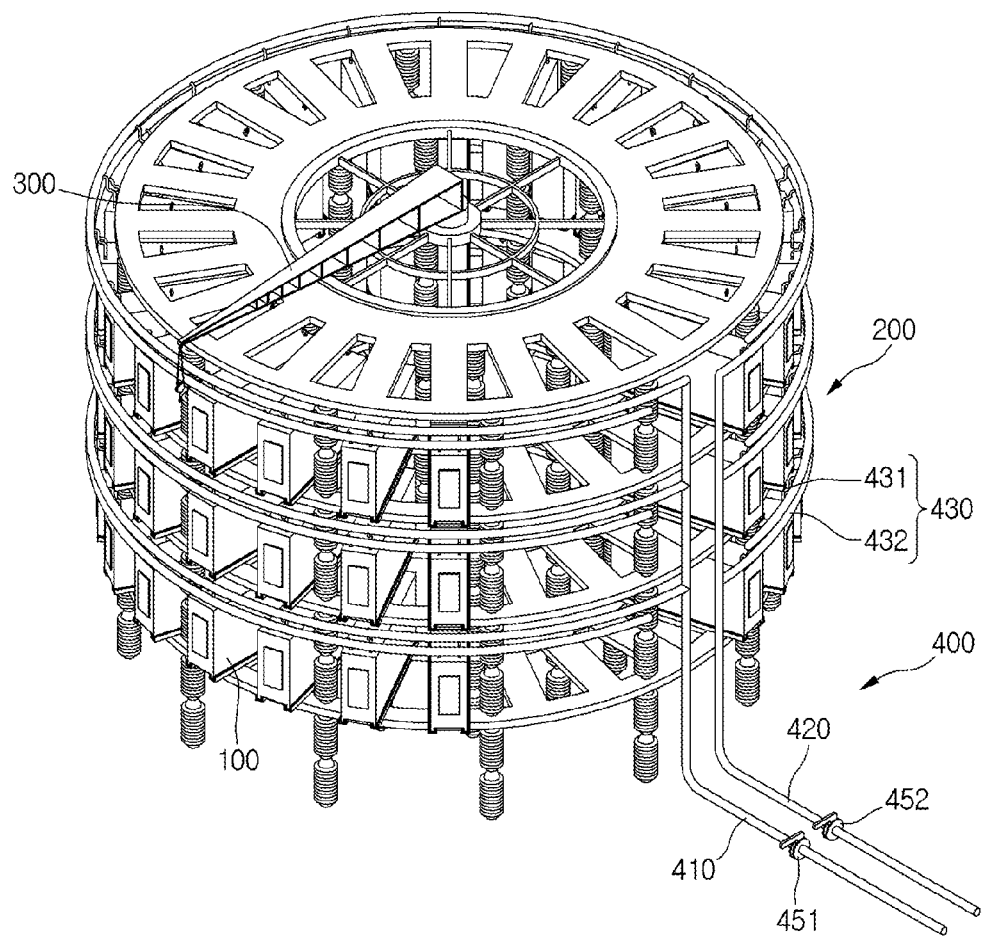

Then, as shown in FIG. 5b, the crane 300 is rotated so that the arm of the crane 300 is located at a position extended in the same direction as a radial extension direction of the valve module 100 to be withdrawn.

Figure 5C:
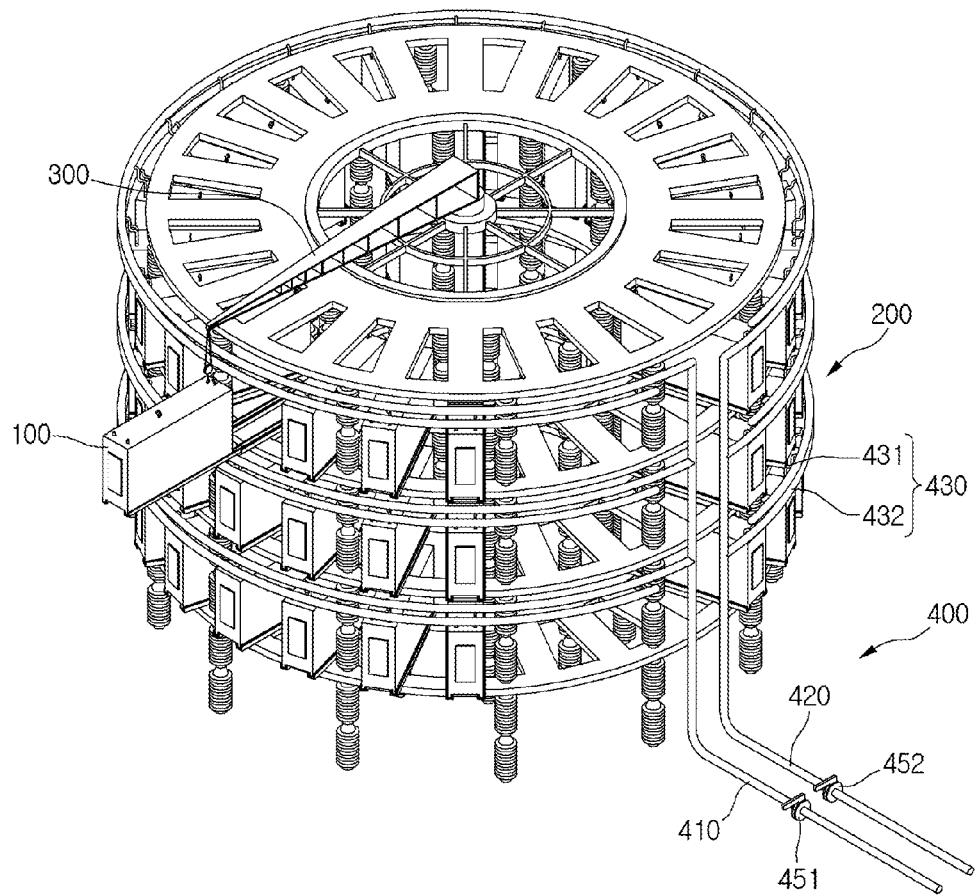

In this state, as shown in FIG. 5c, the valve module 100 is withdrawn to the outside. If force is applied to valve module 100 toward the outside, the moving part 222 is guided by the guide part 221 and moved to the outside, and thus the valve module 100 is withdrawn to the outside. In this state, the crane fixing part 120 of the crane 300 is connected with the crane 300.

If the valve module 100 is connected to the crane 300, the crane 300 lifts up slightly and then rotates a predetermined angle. This is to prevent lifting down of the valve module 100 from being adhered with the moving part, when moving the valve module 100 to the ground or a predetermined height.

Figure 5D:
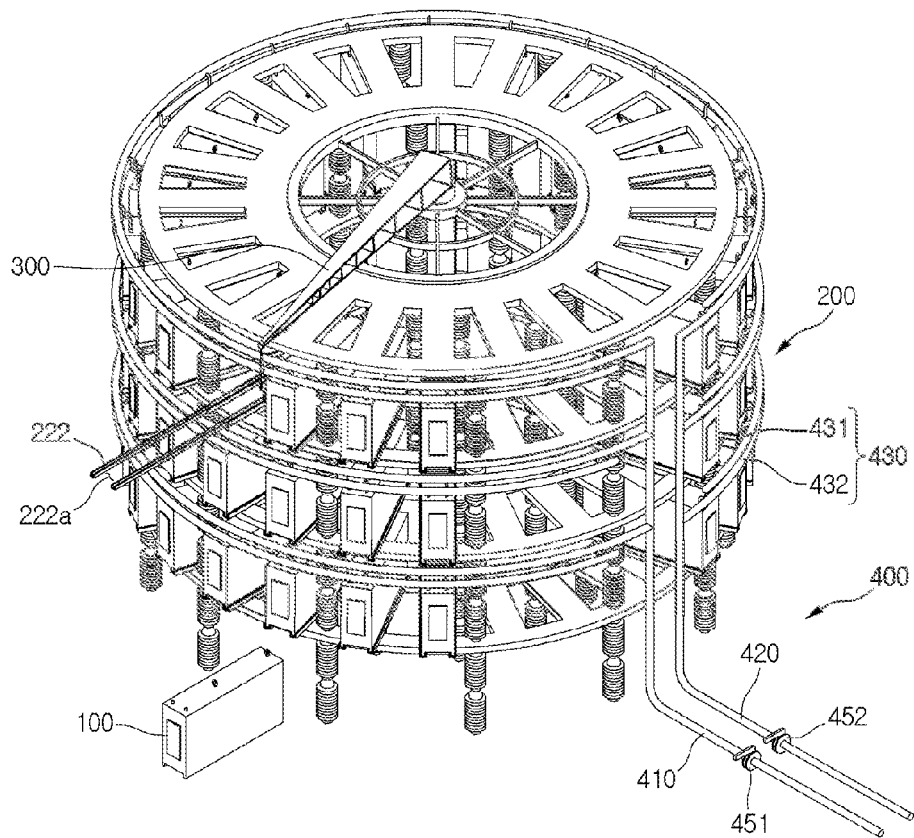

Then, as shown in FIG. 5D, the valve module 100 is moved to the ground or the predetermined height, and the repairing, the checking or the replacing is performed.

Meanwhile, in the above description, the valve module 100 is lifted up by the crane 300, the crane 300 is rotated at the predetermined angle, and then the valve module 100 is lifted down. On the other hand, after the valve module 100 is lifted up by the crane 300, the crane 300 is not rotated, but the moving part 222 may be pushed to an inside, and then the valve module 100 may be lifted down.

And in order to couple again the finished valve module 100 or a new valve module to be replaced to the valve module loading part 200, the above-mentioned process is reversely performed.

First of all, the valve module 100 is connected to the crane 300 and then the crane 300 lifts up the valve module 100.

The valve module 100 is lifted up to a higher position than its original position, and the crane 300 is rotated so that the valve module 100 is located at an vertical upper side of the moving part 222.

In this state, the crane 300 lifts down the valve module 100 so that the valve module 100 is put on the moving part 222, and then the crane 300 is separated from the valve module 100.

And the valve module 100 is pushed to the inside, i.e., in a central direction, and thus the moving part 222 is guided by the guide part 221 and moved to the inside.

When the valve module 100 is located at its own position, the connection pipes 430 of the circulation pipe are connected to the inlet port 111 and the outlet pipe 112 of the valve module 100.

Then, the valve 451 connected to the inlet pipe 410 is opened so that the cooling water is circulated.

According to the present invention, it is easy to withdraw and install the valve module from/at the HVDC valve tower. Therefore, it is easy to perform the checking, repairing and replacing.

Further, it is possible to reduce the cost of equipment for the substation. And even though the valve modules are stacked up and down, it is easy to separate and install the valve modules, and also it is possible to install the HVDC valve tower without any space restriction even under a poor topography condition.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A HVDC valve tower comprising:
a cylindrical valve module loading part having a plurality of stacked layers, wherein each layer of the stacked layers comprises a bottom frame and a plurality of sliding parts, each of the sliding parts is coupled to the bottom frame to be slideable in a radial direction;
a valve module loaded on a respective one of the sliding parts of the valve module loading part; and
a crane rotatably disposed at a center of a top layer of the plurality of the stacked layers of the valve module loading part.

2. The HVDC valve tower according to claim 1, wherein each of the sliding parts comprises, a guide part configured to be fixed to the bottom frame, and a moving part configured to be guided by the guide part to be moved in the radial direction, and the valve module is located on the moving part.

3. The HVDC valve tower according to claim 2, wherein the moving part comprises a first cut-away part passing through the moving part in an up and down direction.

4. The HVDC valve tower according to claim 3, wherein the bottom frame has a plurality of second cut-away parts passing through the bottom frame in an up and down direction, each of the second cut-away parts aligned with a respective one of the sliding parts.

5. The HVDC valve tower according to claim 4, wherein the first cut-away part and the respective one of the second cut-away parts are disposed to be overlapped with each other, when the respective one of the sliding parts is slid to an inside of the bottom frame.

6. The HVDC valve tower according to claim 2, wherein a protruding part is provided at a lower portion of the valve module, and the moving part has a concave portion which is opened upwardly and dented concavely downwardly, and the protruding part of the valve module is received in the concave portion of the moving part.

7. The HVDC valve tower according to claim 1, wherein a crane fixing part is provided on an upper portion of the valve module, the crane fixing part is coupled with a crane for lifting the valve module.

* * * * *